United States Patent [19]
Takeuchi et al.

[11] Patent Number: 5,825,067
[45] Date of Patent: Oct. 20, 1998

[54] DIELECTRICALLY ISOLATED IC MERGED WITH SURGE PROTECTION CIRCUIT AND METHOD FOR MANUFACTURING THE SAME

[75] Inventors: Yoshinori Takeuchi; Koichi Endo, both of Tokyo, Japan

[73] Assignee: Kabushiki Kaisha Toshiba, Kawasaki, Japan

[21] Appl. No.: 873,081

[22] Filed: Jun. 11, 1997

[30] Foreign Application Priority Data

Jun. 12, 1996 [JP] Japan .................................. 8-151044

[51] Int. Cl.$^6$ .......................... H01L 21/782; H01L 29/74
[52] U.S. Cl. ........................... 257/355; 257/520; 257/524
[58] Field of Search ..................................... 257/355, 506, 257/520, 356, 524

[56] References Cited

U.S. PATENT DOCUMENTS 4,985,745  1/1991  Kitahara et al. ...................... 257/506
5,565,697  10/1996  Asakawa et al. ....................... 257/520
5,670,799  9/1997  Croft ...................................... 257/173

*Primary Examiner*—Donald Monin
*Attorney, Agent, or Firm*—Oblon, Spivak, McClelland, Maier & Neustadt, P.C.

[57] ABSTRACT

A semiconductor IC comprising a supporting substrate; a first buried insulator film formed partially on the supporting substrate; a second buried insulator film thinner than the first buried insulator film formed partially on the supporting substrate; a plurality of island-shaped semiconductor layers formed on the first and second buried insulator films, respectively; and dielectric isolation regions formed between the plurality of island-shaped semiconductor layers. A surge protection circuit is formed in the island-shaped semiconductor layer formed on the second buried insulator film and also an internal circuit is formed in other island-shaped semiconductor layers formed on the first buried insulator film. Surface wirings are disposed to interconnect the surge protection circuit and the internal circuit.

17 Claims, 13 Drawing Sheets

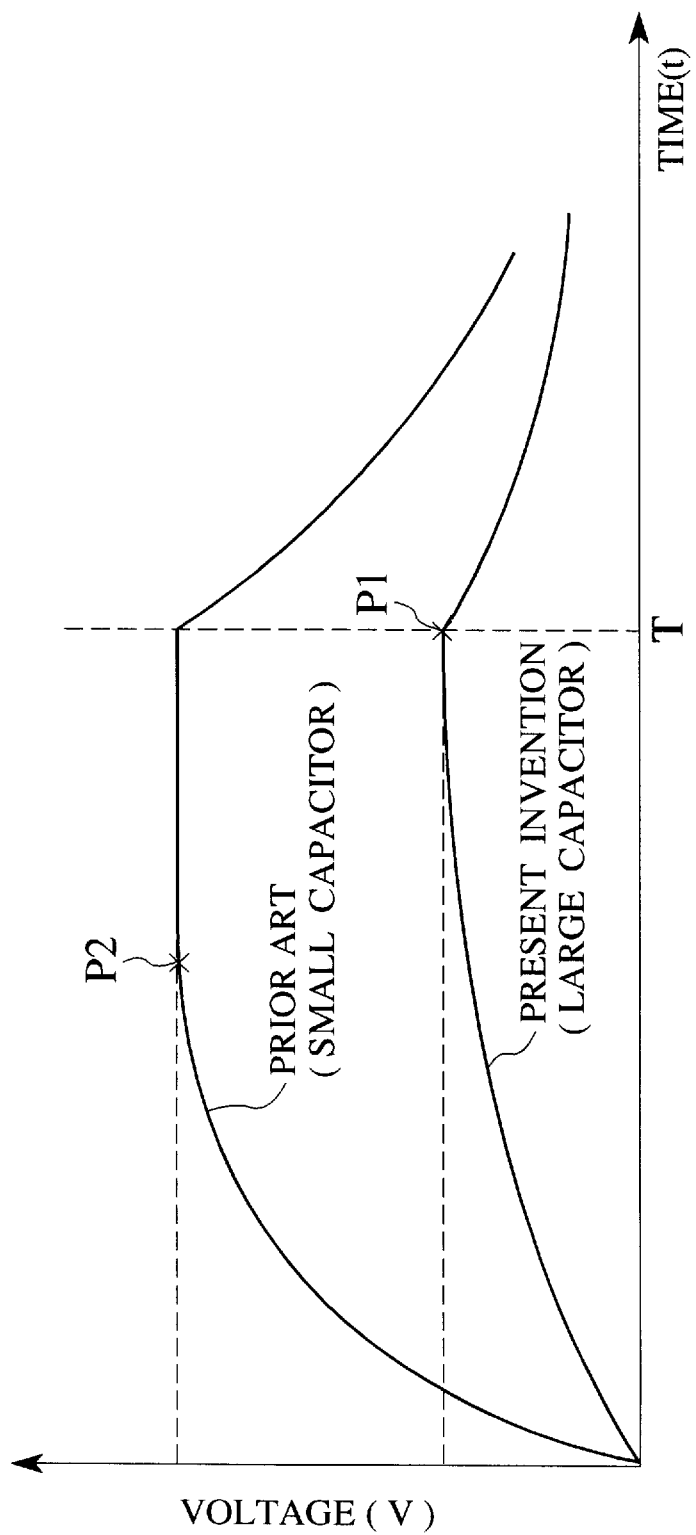

DIELECTRICALLY ISOLATED IC MERGED WITH SURGE PROTECTION CIRCUIT AND METHOD FOR MANUFACTURING THE SAME

BACKGROUND OF THE INVENTION

1. Field of the Invention

The present invention relates in general to a semiconductor IC having a Silicon on Insulator (SOI) structure and more particularly to a semiconductor IC merged with a surge protection circuit and a method for manufacturing the same.

2. Description of the Prior Art

As a conventional surge protection circuit for logic ICs, power ICs, and other semiconductor ICs, the art such as shown in FIGS. 1A and 1B is known. FIG. 1A is a cross-sectional view of an exemplified structure of a conventional surge protection circuit monolithically integrated in a semiconductor chip to form an IC and FIG. 1B, an equivalent circuit thereof. As shown in FIG. 1A, this IC employs the pn Junction isolation (JI) method to isolate elements from each other. That is, after an n⁻-layer 3 is formed on a p-type substrate 111, isolated regions 113 having a p-type diffused layer which ranges from the top surface deep through the p-type substrate 111 are formed, to provide a plurality of island regions. In the surface of one of those island regions, a protection diode 31 is formed which partially consists of an n⁺ layer 11 and a p-type layer 12. In the n⁺ layer 11 which acts as a cathode region are formed two contact holes, through which two metal wirings are connected to an input terminal 30 and an internal circuit 32 respectively. On the other hand, the p-type layer 12 which acts as an anode region is connected to the ground terminal via another metal wiring. As shown in FIG. 1B, the surge protection circuit of FIG. 1A is represented by the protection diode 31, a resistor component 11a of the n⁺ layer 11, and a resistor component 3a of the n⁻ layer 3. And, by keeping the p-type substrate 111 and the isolated p-type layers 113 at a ground potential, the pn junctions existing between island regions themselves are reverse-biased to isolate the element from others electrically.

When a negative surge voltage is applied at the input terminal 30 of a surge protection circuit employing such JI method, to cause a large surge current to flow in the surge protection circuit, the potential difference will be generated between the cathode and anode regions, due to a forward voltage drop ascribed to the internal resistance, i.e. on-state resistance, of the protection diode 31. In this case, a parasitic diode 120 formed between an island region 3 and the p-type substrate 111 constituting the IC structure is connected in parallel with the protection diode 31. Since the surge current can flow through this parasitic diode 120, the total on-state resistance is lowered to provide a small voltage drop as a whole, thus preventing the internal circuit 121 from easily being destroyed. If, however, the JI method is employed to isolate elements from each other, to make them high breakdown voltage-drop ones, it is necessary to give a certain distance between an n⁺ cathode region 114 and the p-type isolated region 113, which suffers from a disadvantage of increased chip size. Moreover, malfunctions may occur when a leakage current flows because of fluctuations in the pn junction polarity (i.e. bias conditions), and the junction temperature.

To guard against this, based on the SOI structure having a monocrystalline or polycrystalline supporting substrate, a buried insulator layer on the supporting substrate and semiconductor layer on the buried insulator layer, the dielectric isolation (DI) method may be employed, in which a plurality of island regions can be isolated from each other by an $SiO_2$ or other insulator, i.e. dielectric. In contrast to the JI method whereby parasitic elements, i.e. reverse-biased pn-junction diodes, are used in isolation, the DI method will completely isolate elements from each other by insulator films, thus eliminating the above-mentioned drawback of the JI method. FIG. 2A is a top view of almost the same surge protection circuit shown in FIG. 1A, which is merged in one of the island regions according to the DI method in an SOI wafer having abovementioned features. FIG. 2B is a cross-sectional view of FIG. 2A in the I—I direction. As well known, in an SOI wafer, each buried insulator layer 2 is vertically sandwiched between upper semiconductor layer 3, 201, 202, . . . and lower semiconductor layer 1. FIGS. 2A and 2B show an example of SOI wafer for the IC in which elements are isolated from each other by almost perpendicular side walls based on the trench isolation method. Hereinafter a horizontal buried insulator layer constituting the SOI structure is called "an SOI insulator 2 layer". That is, a supporting substrate 1, an SOI insulator layer with a prescribed thickness formed on this substrate 1, and an n⁻ layer 3, 201, 202, . . . formed on this SOI insulator 2 constitute an SOI wafer. This n⁻ layer of an SOI wafer is divided into a plurality of island regions 3 and 201 through 205, i.e. mutually isolated elements. In the boundary between the island region 3 and the adjacent ones 201 through 205, a trench reaching from top surface to the SOI insulator layer 2 is formed, having a side wall made of a silicon oxide film ($SiO_2$). Moreover, a thick polysilicon layer 5 is deeply deposited in the trench to bury it.

In the surface of the n⁻ layer 3 having those island regions therein are formed an n⁺ diffused layer 11 which acts as the cathode region and also a p-type diffused layer 12 which acts as the anode region, so that the whole surface of the SOI wafer is thoroughly masked by an $SiO_2$ film 13. The n⁺ diffused layer 11 which acts as the cathode region is connected with the input terminal via a first cathode contact electrode 16 and Al wiring 21. And also the n⁺ diffused layer 11 is connected with the internal circuit via a second cathode contact electrode 17 and another Al wiring 22. To the p-type diffused layer 12 which acts as the anode region of the protection diode is also connected an Al wiring 23 via an anode contact electrode 19. The Al wiring 23 is connected to the GND terminal. When an SOI wafer is used therefore, a parasitic capacitor 202A exists across the SOI insulator layer 2 sandwiched between the n⁻ layers and the supporting substrate 1. With this, by connecting the supporting substrate 1 to the GND potential, the parasitic capacitor 202A is connected in parallel with the protection diode 31 as shown in the equivalent circuit of FIG. 2C. Note that in FIG. 2C a resistor 11a is ascribed to the resistivity in the above-mentioned n⁺ layer 11 and a resistor 3a is an equivalent one of the n⁻ layer 3.

In an IC made out of such an SOI wafer as described above, if a surge with a relatively small surge current is applied at the input terminal, the internal circuit 32 is protected by the protection diode 31. In an IC made out of a conventional SOI wafer, however, if a relatively large current flows through it, a large voltage drop occurs across the protection diode 31, which has a specific internal resistance (on-state resistance), so that a high voltage due to this voltage drop occurs on the input terminal side of the internal circuit. That is, in contrast to the JI method, the DI method has no parasitic diodes and so cannot reduce the voltage drop due to the internal resistance (on-state resistance), so that a relatively high voltage is applied to the internal circuit 32. Hence the breakdown voltage of the internal circuit 32 is easily reached in DI structure.

To solve this problem, conventionally, by increasing the area where the protection diode 32 is formed, the on-state resistance has been lowered to reduce the voltage drop across the protection diode 31. In consideration of the safety factor, however, this method may suffer from an increased area of the protection diode, possibly larger than the area occupied by internal circuits to be protected. An increase in the area of the protection diode, therefore, may lead to another problem of an increase in the size of the chip as a whole.

SUMMARY OF THE INVENTION

It is therefore an object of the present invention to provide a dielectrically isolated IC employing SOI wafer which is equipped with a surge protection circuit preventing the internal circuit in the IC from being destroyed by a large surge current, without increasing the chip size.

Another object of the present invention is to provide a method for manufacturing easily a dielectrically isolated IC whose internal circuits will be protected from large surge current, without increasing the chip size.

To this end, the present invention prescribes the semiconductor ICs based on such an SOI structure that comprises a supporting substrate, a first and a second buried insulator films partially formed on the supporting substrate, and a plurality of semiconductor active layers formed directly on these first and second buried insulator films and isolated from each other by dielectric isolation regions. That is, the first feature of the present invention is that the second buried insulator film is made thinner than the first one and that a plurality of first semiconductor active layers and a second semiconductor active layer are positioned directly on the first buried insulator film and the second buried insulator film respectively. And a surge protection circuit is formed in the second semiconductor active layer. In the first semiconductor active layers, an internal circuit is formed. The surge protection circuit is provided to protect the internal circuit in the first semiconductor active layer from surge voltage. The surge protection circuit is directly connected with the internal circuit's input/output terminals by prescribed surface wirings. That is, the surge protection circuit may be given either on the input side or the output side or both sides of the internal circuit. The surge protection circuit has, as one of the main circuit elements, a protection diode which includes a first conductivity-type high impurity-concentration region acting as the cathode region and a second conductivity-type high impurity-concentration region acting as the anode region. The cathode and anode regions are formed in the second semiconductor active layer. A surface isolation film is formed on the second semiconductor active layer. In the surface isolation film on the cathode region are formed a first and a second contact holes. The cathode region is connected to the input terminal of the surge protection circuit through the first contact hole and to the internal circuit through the second contact hole. The anode region of the protection diode is connected to a reference potential (GND terminal) through a third contact hole in the surface isolation film on the second semiconductor active layer.

Since a structure of the present invention having the above-mentioned first feature has a thin, second buried insulator film positioned between the supporting substrate and the second semiconductor active layer in which the surge protection circuit is formed, when the supporting substrate is connected to the GND potential, a large capacity parasitic capacitor 2A is connected in parallel, on a equivalent circuit representation such as shown in FIG. 3C, between the anode and the cathode of the protection diode 31. Even if, therefore, the protection diode has a relatively large on-state resistance, a large voltage drop does not appear across the protection diode. This is because the surge protection circuit works as a low-pass filter having a large RC time constant. Hence, no high voltage occurs across the protection diode even when a high surge voltage is applied in pulses. This prevents a high surge voltage from being transmitted into the internal circuit even in the case where the protection diode occupies a relatively small area for itself. On the other hand, at the bottom of the first semiconductor active layer, in which the surge protection circuit is not formed, a thick, first insulator film is formed. Then it is possible to keep the DC breakdown voltage of the internal circuit formed in the first semiconductor active layer at a high voltage.

The second feature of the present invention relates to the method of manufacturing semiconductor ICs having the above-mentioned feature. That is, the method of manufacturing semiconductor ICs related to the second feature of the present invention at least comprises: a first step whereby on the main surface of the first semiconductor substrate which acts as a semiconductor active layer, an insulator layer partially thinned by LOCal Oxidation of Silicon (LOCOS) method is formed and then its surface is flattened; a second step whereby onto thus flattened insulator layer, a second semiconductor substrate which acts as the supporting substrate is bonded by the Silicon Direct Bonding (SDB) method; a third step whereby the first semiconductor substrate is divided into a plurality of semiconductor active layers by dielectric isolation regions so as to form a plurality of first semiconductor active layers on a thick part of the insulator layer and second semiconductor active layer on a thinned part of the insulator layer; a fourth step whereby semiconductor regions for the surge protection circuit are formed in the second semiconductor active layer and in the first semiconductor active layer is formed semiconductor regions for the internal circuit; and a fifth step whereby the surge protection circuit is connected to the input/output terminals of the internal circuit by use of surface wirings and, at the same time, prescribed wiring is performed to constitute the surge protection circuit.

This second feature employs an ordinary LOCOS method, thus enabling to easily form an SOI structure having a partially thinned insulator layer, i.e. a buried insulator film having a thick and a thinned parts.

The partially thinned buried insulator film may be obtained also as follows. An alternative method comprises: a first step whereby prescribed regions of the surface of the first semiconductor substrate which acts as a semiconductor active layer are locally masked by a mask material, so that this first semiconductor substrate surface not covered by the mask material may be selectively etched by the RIE method etc. to form shapes including convex steps; a second step whereby on the surface of the first semiconductor substrate having those convex steps is formed an insulator layer having a thickness larger than the level difference of those convex steps; and a third step whereby thus formed insulator layer's surface is flattened so as to provide partially thinned insulator portions, onto which is bonded a second semiconductor substrate which acts as the supporting substrate is bonded by the SDB method.

A further alternative method may be such that by exchanging the first semiconductor substrate and the second one with each other, the supporting substrate is shaped into convex, corrugated steps to form an insulator film, which is then bonded with another semiconductor substrate which acts as an active layer after the flattening, to provide a partially thinned insulator film. In this case, the buried insulator layer is formed having a consistent flat surface at the semiconductor active layer side as well as a downward concave portion at the supporting substrate side. By providing the downward concave at the lower side, the chip size can be decreased.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 4 is a graph illustrating differences in the voltage waveforms of the transient response to a surge voltage with a large and a small parasitic capacitors.

DETAILED DESCRIPTION OF THE EMBODIMENTS

Figure 1A:
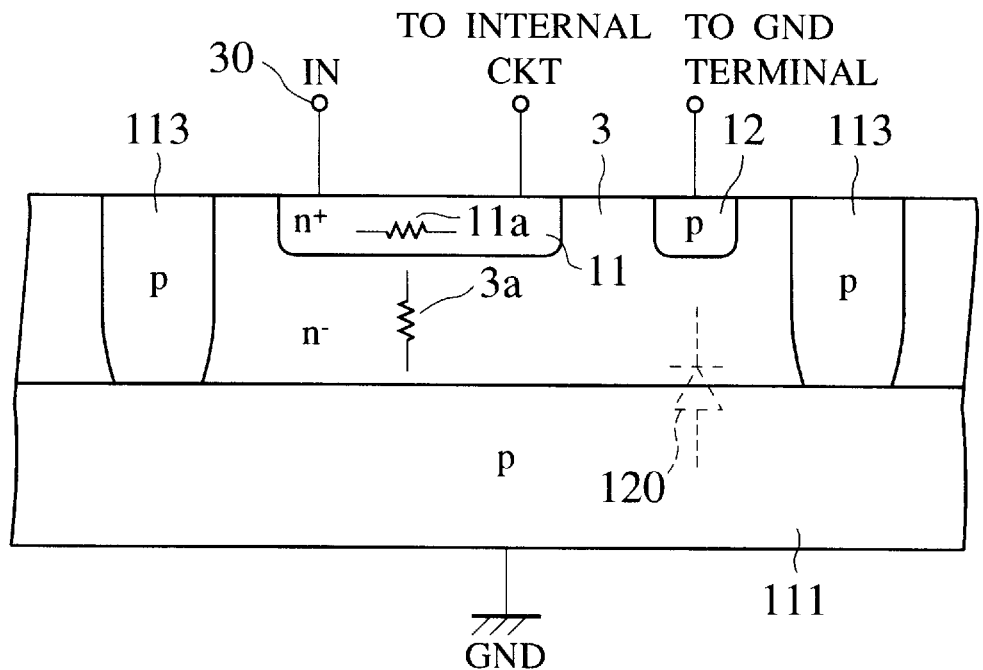
FIG. 1 is a cross-sectional view of a conventional surge protection circuit formed in a pn junction isolation (JI) substrate, with FIG. 1B showing an equivalent circuit of FIG. 1A.
Figure 1B:
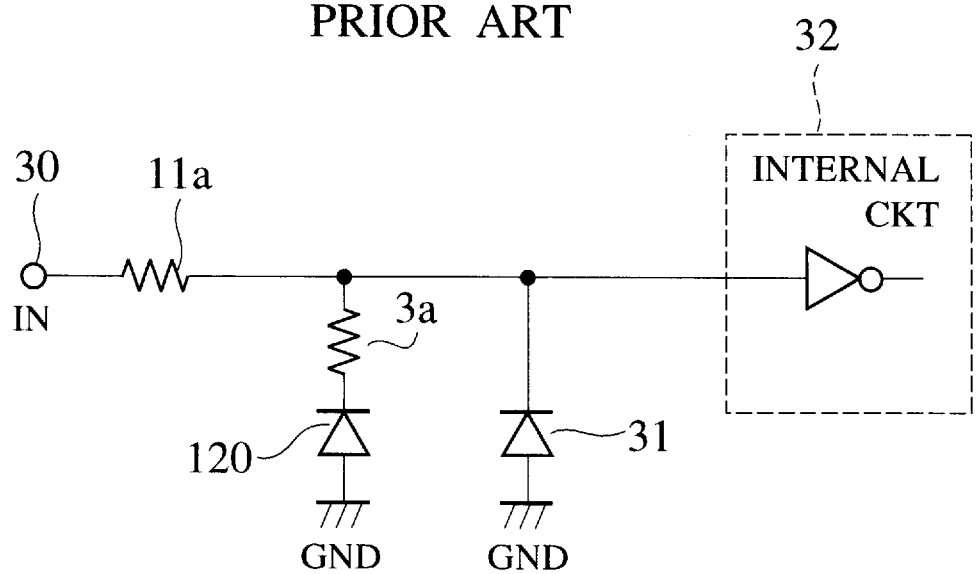

Various embodiment of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(First Embodiment)

Figure 2A:
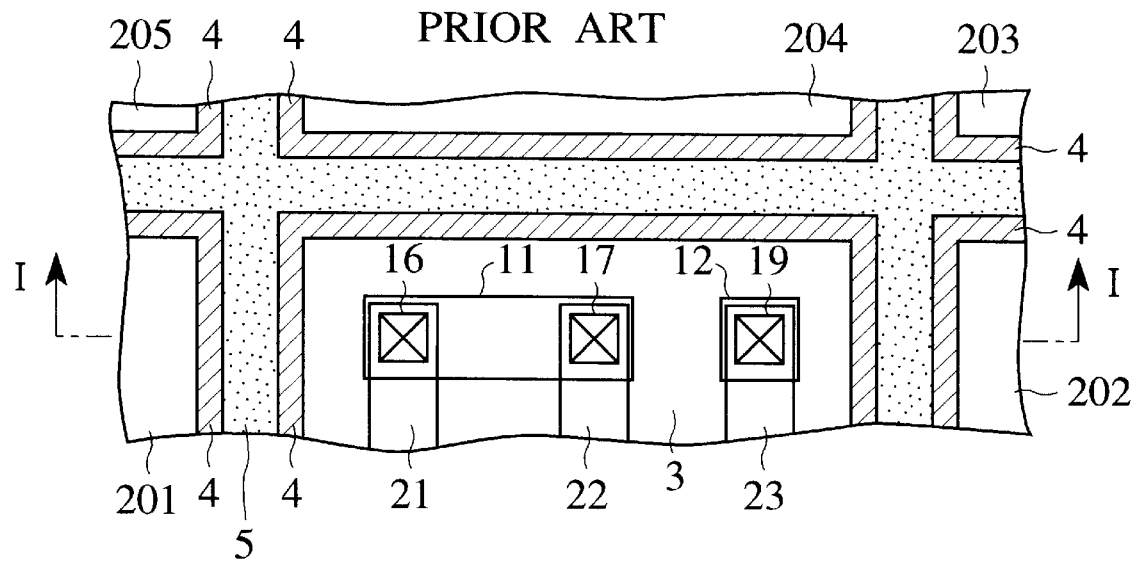
FIG. 2A is a plan view of a conventional surge protection circuit formed in a dielectric isolation (DI) substrate, with FIG. 2B being a cross-sectional view of FIG. 2A in the I—I direction.
Figure 2B:
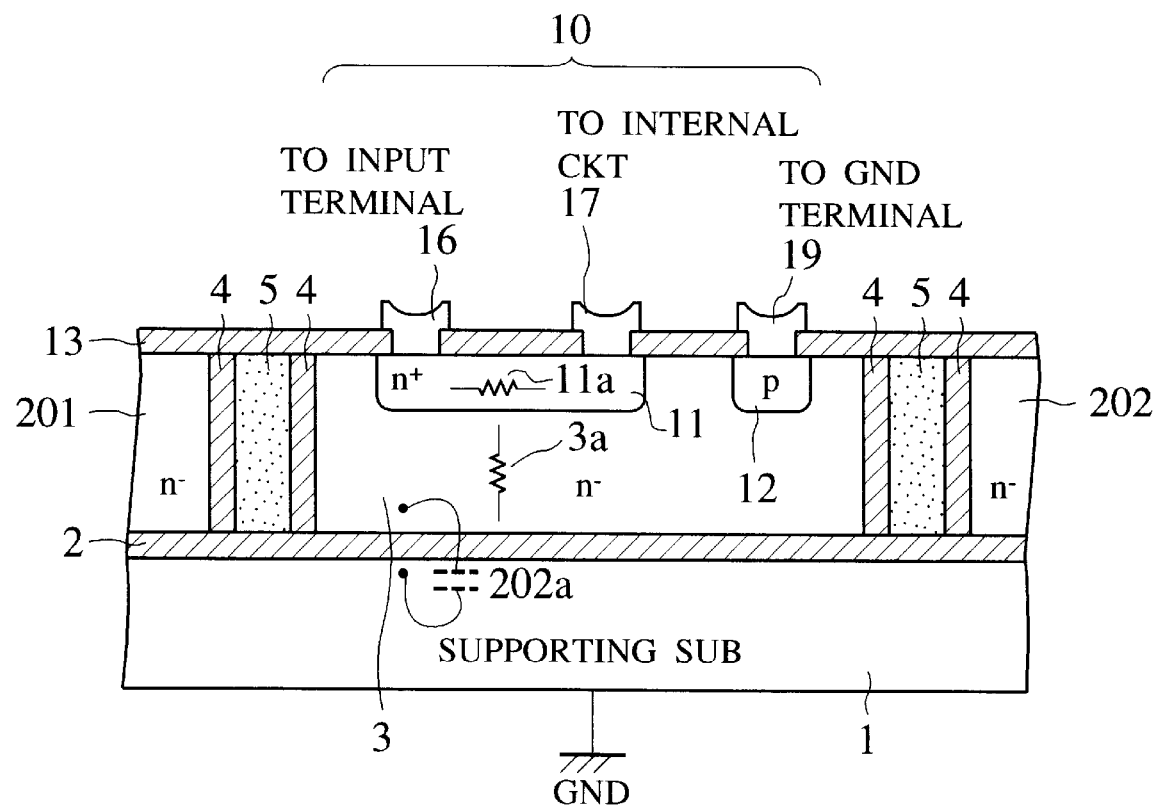
FIG. 2C is an equivalent circuit diagram of a surge protection circuit shown in FIGS. 2A and 2B.
Figure 3A:
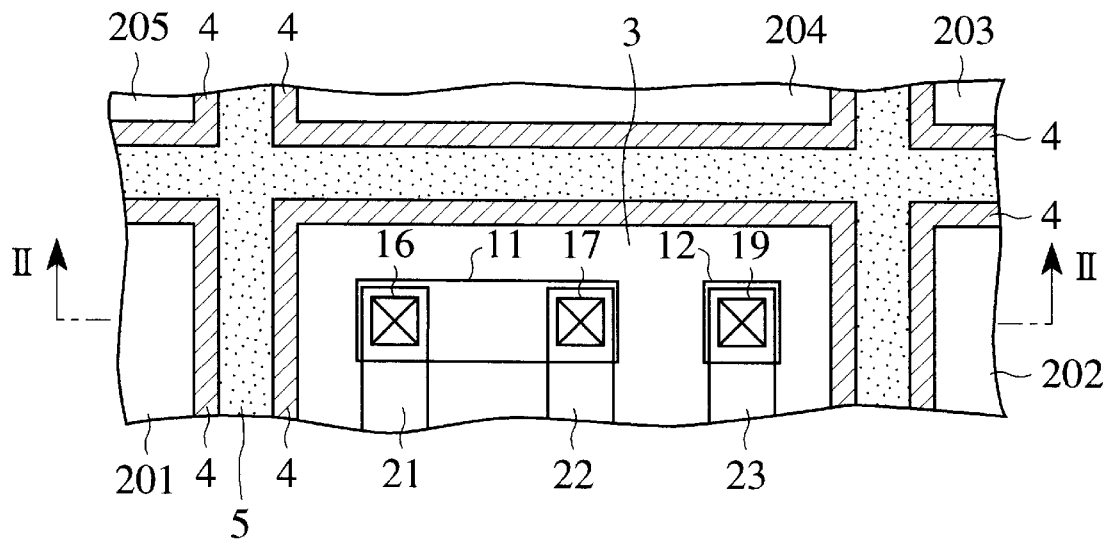
FIG. 3A is a plan view of a surge protection circuit merged in a semiconductor IC related to the first embodiment of the present invention, with FIG. 3B being a cross-sectional view of FIG. 3A in the II—II direction.
Figure 3B:
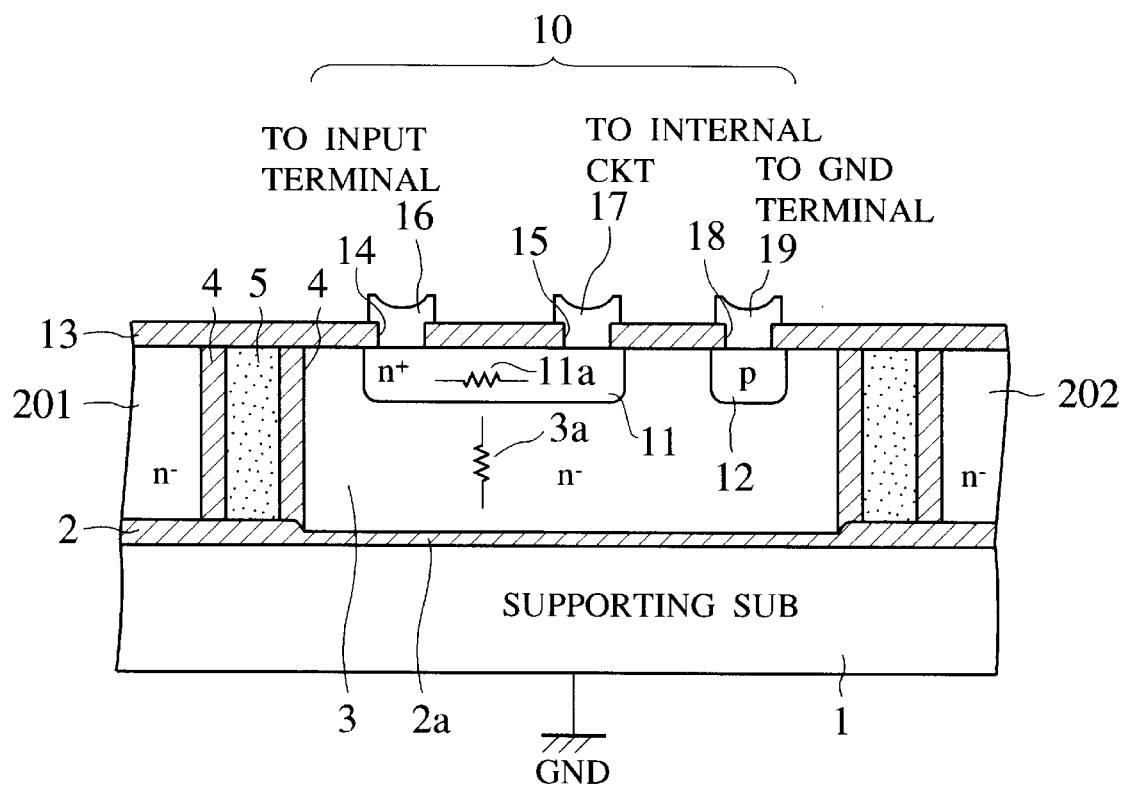
FIG. 3C is an equivalent circuit diagram of a surge protection circuit of the first embodiment of the present invention.

FIG. 3A is a top view of a surge protection circuit merged with an internal circuit to form a semiconductor IC related to the first embodiment of the present invention. And FIG. 3B is a cross-sectional view of FIG. 3A in the II—II direction. The semiconductor IC related to the first embodiment of the present invention employs an SOI wafer as shown in FIG. 3B and is made by the trench isolation method using a trench having perpendicular side walls as inter-element isolation regions. In one of a number of island regions thus isolated, a surge protection circuit is formed. That is, an IC related to the first embodiment has a plurality of first semiconductor active layers which are island regions in which the internal circuit etc. are formed and also a second semiconductor active layer in which the surge protection circuit is formed. In contrast to the conventional semiconductor IC shown in FIG. 2B, a structure shown in FIG. 3B is such that as compared to a first buried insulator film under island regions (first semiconductor active layers) 201 through 205 in which the internal circuit etc. are formed, a second buried insulator film 2a under another island region (second semiconductor active layer) 3 in which the surge protection circuit is formed is locally thinned. That is, a semiconductor IC according to the first embodiment of the present invention is based on such an SOI structure that on a supporting substrate 1, first n⁻ layers 201 through 205 and a second n⁻ layer 3 are formed via a first or second buried insulator film 2 or 2a therebetween which are made of $SiO_2$ films etc. The n⁻ layers 3 and 201 through 205 are formed in island regions mutually isolated by dielectric insulation regions. The first buried insulator film 2 may have a thickness of one (1) to five (5) micrometers. Each island is surrounded by a trench isolation region. Each trench is so formed as to reach from the top surface to the first buried insulator film 2. The trench has its inner walls made of $SiO_2$ films 4 and is buried by a thick polysilicon layer 5 deposited deeply.

The first embodiment of the present invention employs a peculiar island region 3 dedicated to a surge protection circuit out of a number of island regions. That is, the thickness of the buried insulator film 2a (second buried insulator film) on which the island region 3 for the surge protection circuit exists is made thinner than those of the other buried insulator films (first buried insulator films). Hereinafter, a thinner formed buried insulator film (second buried insulator film) is called a "thin-film insulator layer" 2a and the other thicker buried insulator film (first buried insulator film), an "SOI insulator layer" 2 for discrimination. The thin-film insulator layer 2a should preferably have a thickness of 50 to 200 nanometers for example. As shown in FIG. 3B, both top surface of the SOI insulator layer 2 and the thin-film insulator layer 2a are formed on the same plane at the supporting substrate 1 side. On its opposite side, or at the n⁻ layer 3 side, only the thickness of the insulator layer under the island region for the surge protection circuit is made smaller to provide a step between the thin-film insulator layer 2a and the SOI insulator layer 2, thus forming an upward concave shape.

This island region 3 made of an n⁻ layer for surge protection circuit has an n⁺ diffused layer 11 which acts as the cathode region and a p-type diffused layer 12 which acts as the anode region both of which are selectively formed in the surface, to form a protection diode for the surge protection circuit. The wafer surface is masked by an $SiO_2$ film 13, and a first and a second contact holes 14 and 15 are formed in the film 13 so that the n⁺ diffused layer 11 is connected with first and second cathode contact electrodes 16 and 17 respectively through the first and second contact holes. And also through a contact hole 18 the p-type diffused layer 12 is connected with an anode contact electrode 19. The first cathode contact electrode 16 is connected via an Al wiring 21 to the input terminal, the second cathode contact electrode 17 is connected via an Al wiring 22 to the internal circuit, and the anode contact electrode 17 is connected via an Al wiring 23 to the GND terminal.

Figure 2C:
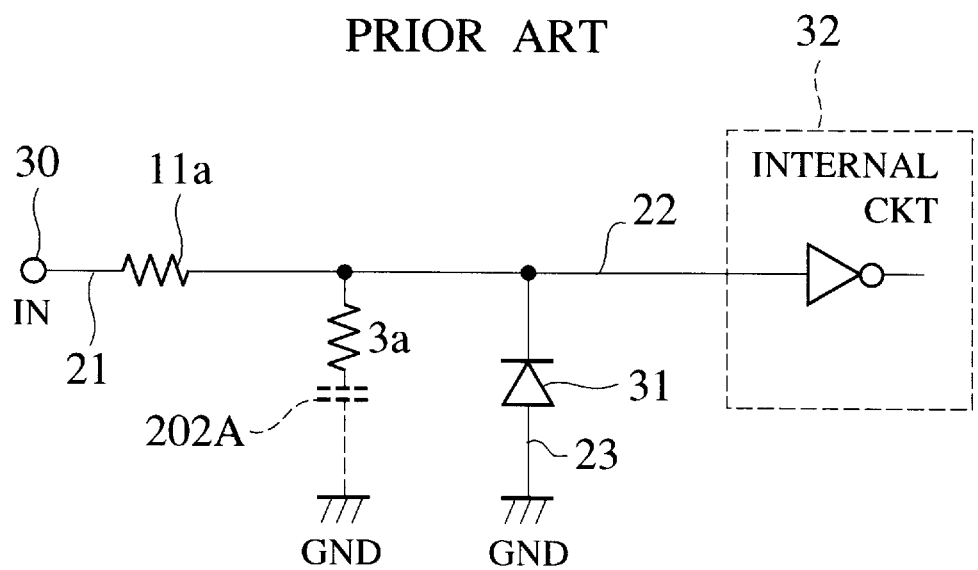
Figure 3C:
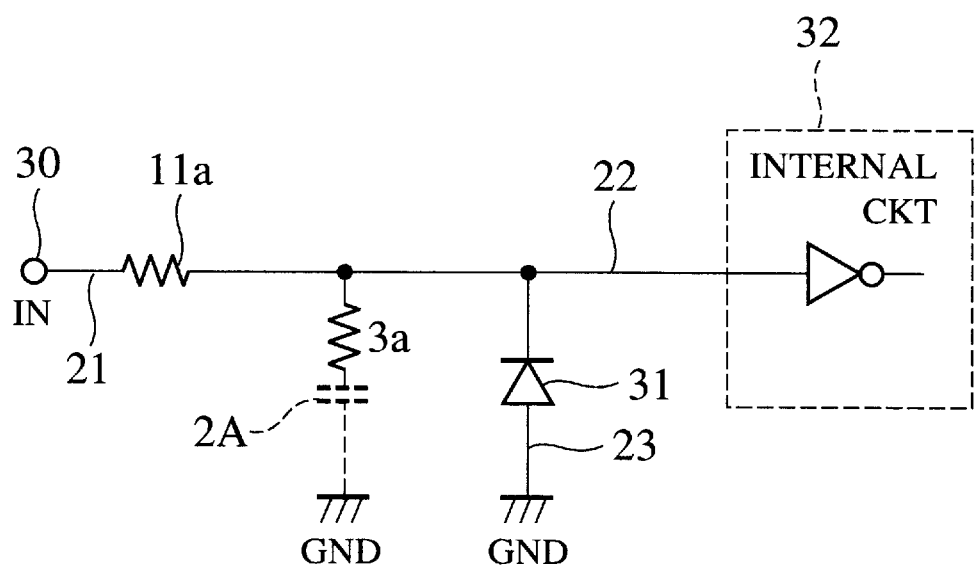

FIG. 3C shows an equivalent circuit diagram of a surge protection circuit related to the first embodiment of the present invention. The connection configuration for various elements shown in it is almost the same as the equivalent circuit diagram for a prior-art IC shown in FIG. 2C. A resistor 11a shown in FIG. 3C is a resistor component in the n$^+$ diffused layer 11 and a resistor 3a is a resistor component in the n$^-$ layer 3. The resistor 11a has its one end connected to an input terminal 30 and its other end connected to the cathode of the protection diode 31. This cathode of the protection diode 31 is connected to the internal circuit 32. A parasitic capacitor 2A ascribed to the thin-film insulator layer 2a is connected via the resistor 3a between the GND terminal and the cathode of the protection diode 31. That is, a series circuit consisting of the resistor 3a and the parasitic capacitor 2A is connected in parallel between the cathode and the anode of the protection diode 31. This parasitic capacitor 2A has a larger capacitance than that of the same area of a capacitor in a conventional SOI wafer.

As described earlier, the first embodiment of present invention features that the thin-film insulator layer 2a, i.e. the buried insulator film under the island region 3 in which the surge protection circuit is formed is formed thinner than the other portions. As can be seen from a structure shown in FIG. 3B, the parasitic capacitor 2A ascribed to the thin-film insulator layer 2a has rather a large capacitance, thus increasing the magnitude of the CR time constant relating to the input impedance of the surge protection circuit.

In the above-mentioned structure of surge protection circuit, when a positive potential of surge enters the input terminal 30, the protection diode 31 is reverse-biased. Therefore, the potential at the input terminal 30 is raised, and if it exceeds a reverse-bias breakdown voltage of the protection diode 31, it breaks down, to cause the surge current to flow into the GND line, thus preventing the potential applied to the internal circuit 32 from rising any more.

When a negative-potential surge enters the input terminal 30, the protection diode 31 is forward-biased, to cause the surge current to flow from the GND line into the input terminal 30. If the surge current is relatively small, the protection diode 31 has a relatively small forward voltage drop and therefore no voltage higher than a prescribed value is applied onto the internal circuit, to protect it from the surge current. If a relatively large surge current flows in a pulse for extremely short lapse of time, the peak value of the surge voltage is reduced as shown at a point P1 in FIG. 4, because the CR time constant of the surge protection circuit has been increased by a large capacity of the parasitic capacitor 2A. Note here that a point P2 indicates a peak value of the surge voltage with the prior art whereby the parasitic capacitor has a relatively small capacitance. If the CR time constant is large, the surge peak value will not reach a high value within the time of a prescribed pulse width T during which the surge voltage is applied, so that the surge voltage starts attenuating from this small peak value immediately after the surge voltage disappears. As can be seen from FIG. 4, the larger the capacitance C of the parasitic capacitor, the lower will be the peak value of the voltage V. A voltage drop across the anode through the cathode of the protection diode 31 does not depend on the on-state resistance of the protection diode 31 and so can be set at a small value determined by the transient response of the low-pass filter, thus protecting the internal circuit 32 against the large surge current.

Therefore, the first embodiment of the present invention will make locally thinner the SOI insulator layer directly under an island region in which the surge protection circuit is formed to make the CR time constant of the surge protection circuit larger, thus actually suppressing down to a small level the voltage applied to the internal circuit at its input terminal even when the on-state resistance of the protection diode is rather large for the large surge current. The first embodiment of the present invention uses the parasitic capacitor 2A as one of the surge protection circuit elements as shown in FIG. 3C, to improve the surge immunity. Also, for island regions 201 through 205 other than the island region 3 for the protection circuit, the SOI insulator layer 2 is kept thick, thus securing a prescribed value of the DC breakdown voltage.

Moreover, this embodiment only needs a larger capacitance of the parasitic capacitor, thus eliminating the necessity of any special space occupied by the protection diode, which may otherwise have to be larger in order to reduce the on-state resistance. This prevents the chip size as a whole from becoming larger.

According to the first embodiment of the present invention, the buried insulator film has an upward concave-shaped cross section. As much as a level difference at concave-shaped step between the thin-film insulator layer 2a and SOI insulator layer 2, the thickness of the n$^-$ layer 3 is made thicker. That is, the CR time constant is made larger because of an increase in resistance due to this larger thickness, and further hard surge protection for the internal circuit 32 is assured.

The following describes a method of manufacturing semiconductor ICs related to the first embodiment of the present invention with reference to the step diagrams of FIGS. 5A through 5G.

Figure 5A:
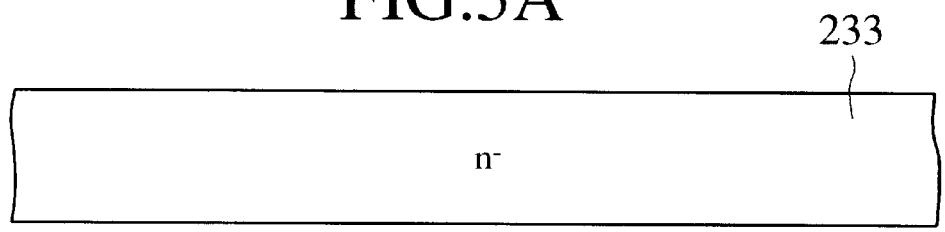
FIGS. 5A through 5G are step diagrams showing a method of manufacturing semiconductor ICs related to the first embodiment of the present invention.
Figure 5B:
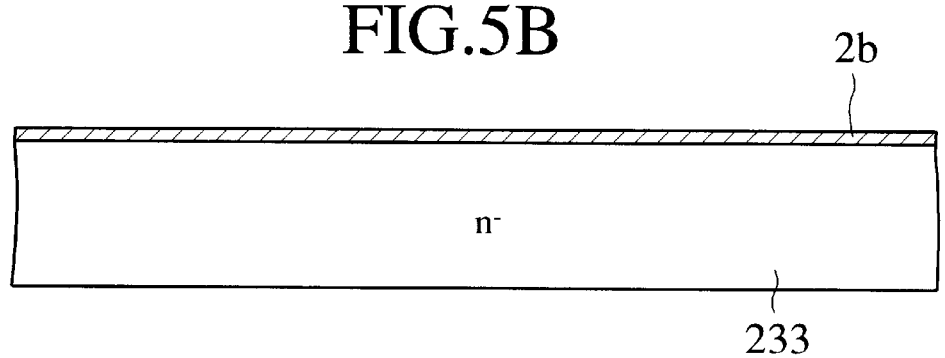
Figure 5C:
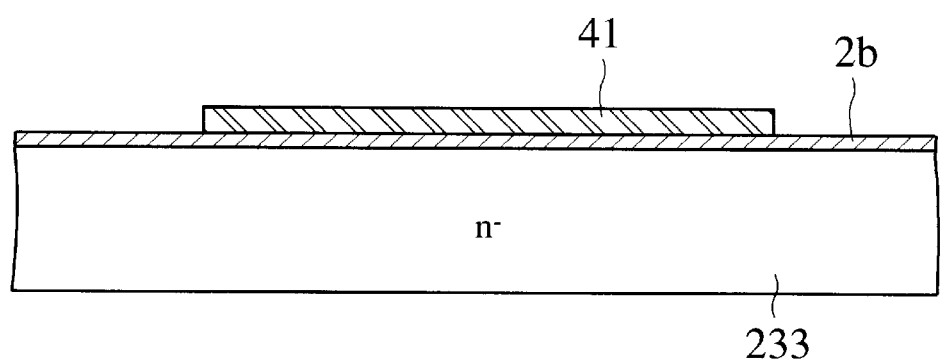
Figure 5D:
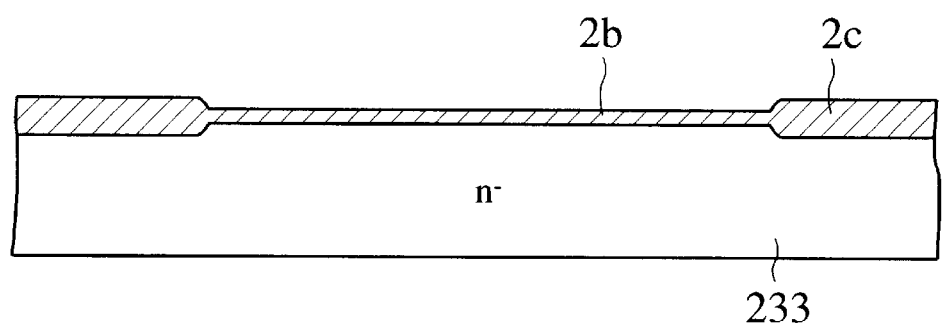

Step (a): First, as shown in FIG. 5A, a semiconductor substrate 233 is given to be used as an active layer, on which different thicknesses of oxide films (SiO$_2$ films) are formed by the LOCOS method used for ordinary IC processing such as shown in FIGS. 5B through 5D. That is, a thinner oxide film (SiO$_2$ film) 2b is formed at a corresponding portion above which a surge protection circuit is formed and a thicker oxide film 2c is formed in other portions. More specifically, first, on the n$^-$ semiconductor substrate 233 given as shown in FIG. 5B, a thin SiO$_2$ film 2b having a thickness of 50 to 300 nanometers is formed. Next, as shown in FIG. 5C, on the thin film 2b, an Si$_3$N$_4$ film 41 having a thickness of 100 to 200 nanometers is deposited by the CVD method and then patterned by the photolithography and RIE methods. As a result, the Si$_3$N$_4$ film 41 is left only in the regions above which the surge protection circuit elements are to be formed.

The wafer as processed in such a way is oxidized for a prescribed lapse of time in an oxidizing atmosphere at a high temperature of 1050 to 1150 degrees Celsius, to oxidize selectively the surfaces of wafer which are not masked by the Si$_3$N$_4$ film 41, making such local portions of the SiO$_2$ film 2b thicker than those where the Si$_3$N$_4$ film 41 exists. The temperature and the time for oxidization may be set so that the thicker oxide film 2c would have a thickness of 0.8 to 3 micrometers. The wafer may be oxidized under a high pressure to make the oxide film 2c thicker. Then, the RIE method is used to remove only the Si$_3$N$_4$ film 41, to provide a wafer having locally thinned buried insulator layer 2b.

Figure 5E:
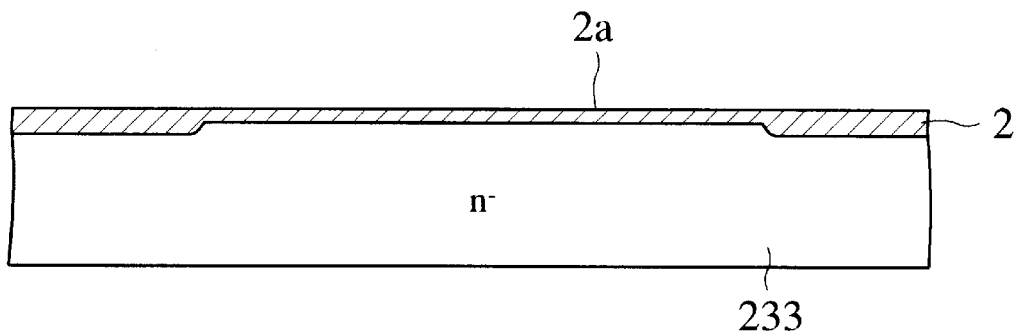
Figure 5F:
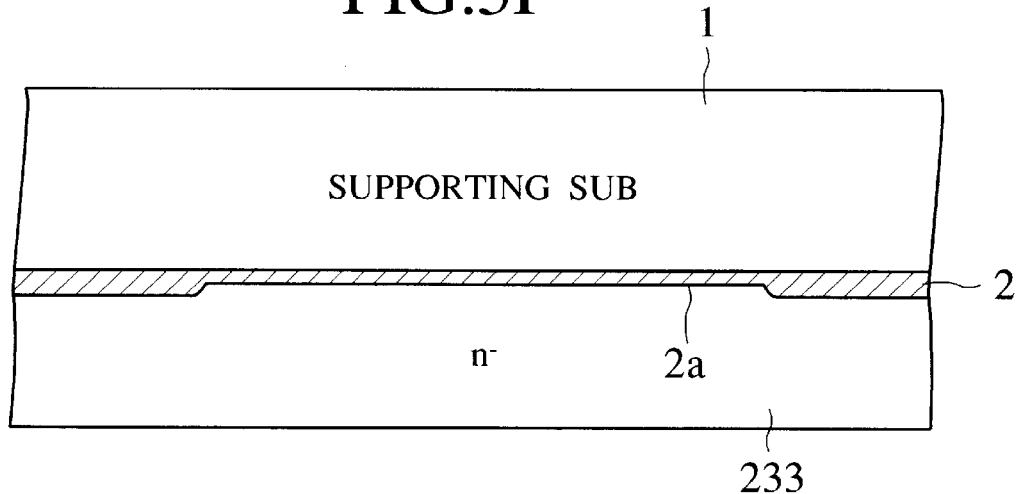

Step (b): Next, as shown in FIG. 5E, the Chemical Mechanical Polishing (CMP) method etc. is used to flatten and polish the overall surfaces of the SOI insulator layers 2b and 2c to obtain a thin-film insulator layer 2a and an SOI insulator layer 2 so that the thin-film insulator layer 2b may have a thickness of 50 to 200 nanometers. As shown in FIG. 5F, the Silicon Direct Bonding (SDB) method etc. is used to bond a supporting substrate 1 via the thin-film insulator layer 2a and the SOI insulator layer 2 onto the n⁻ semiconductor substrate 233, thus providing a concave-shaped step portion of insulator layer at the side of the n⁻ semiconductor substrate 233 to give an SOI substrate according to the first embodiment of the present invention.

Figure 5G:
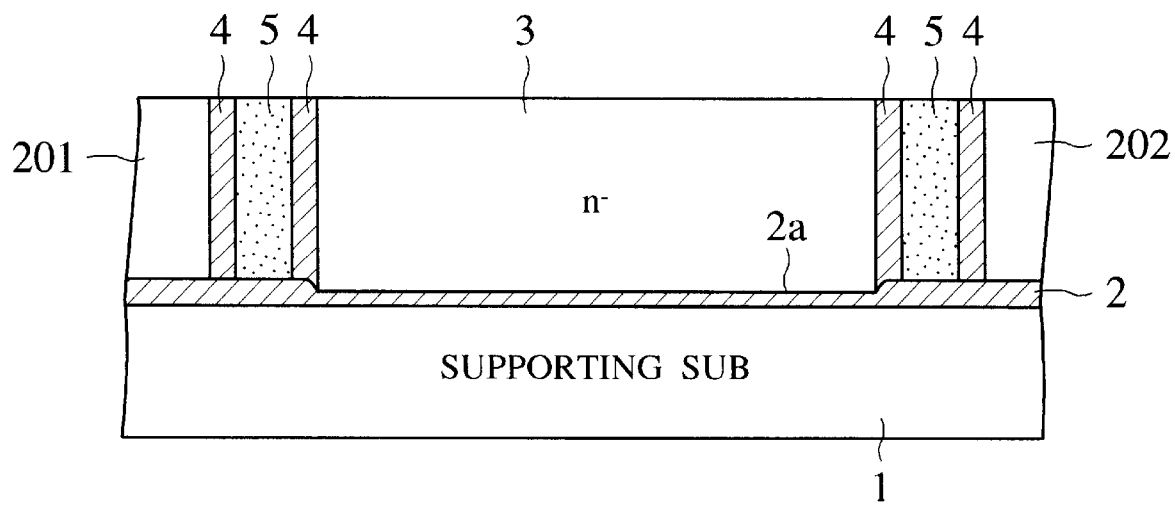

Step (c): The n⁻ layer 233 is polished down to a desired thickness, then, as shown in FIG. 5G, the wafer is turned upside down, to form inter-element isolation regions. To isolate elements from each other, the first embodiment of the present invention employs the trench isolation such as shown in FIG. 3B. That is, a trench processing method such as the Cl-based RIE or ECR ion-etching method is used to dig trenches reaching from top surface to the SOI insulator layer 2, the side walls of which trenches are then masked with an $SiO_2$ film 4 by thermal oxidation method etc. The CVD method is subsequently used to fill the gaps between the $SiO_2$ films 4 themselves with a polysilicon layer 5, which acts as a component of dielectric isolation region to define mutually isolated element formation regions (semiconductor active layers) 3, 201, and 202. Then, a known IC manufacturing process is performed to form the elements. That is, as shown in FIGS. 3A and 3B, an ion-implantation method is used to selectively form an $n^+$ diffused layer 11 and p-type diffused layer 12 in the surface of the n⁻ layer 3 (second semiconductor active layer) for surge protection circuit, to form semiconductor regions for the protection diode. At the same time, the ion-implantation method, the CVD method, RIE method, etc. are used to form prescribed semiconductor regions etc. for the internal circuit in the other island regions (first semiconductor active layers). Then, as shown in FIG. 3A, a metal wiring 22 and other prescribed wirings are disposed to directly interconnect the internal circuit and the surge protection circuit.

As the inter-element isolation method, other methods such as the V-trench isolation method using the unisotropic etchants, which are also known as orientation-dependent etching material such as potassium hydroxide (KOH) solution, or ethylenediamine pyrocatecol (EDP) solution, may be employed. By the unisotropic etching, the boundary between the side-wall film in the dielectric isolation region and the first or second semiconductor active layer constitutes an obliqued side-wall surface at prescribed angle (for example 35.3, 54.7, or 70.5 degree, etc.) relative to the main surface of the first/second semiconductor active layer, thereby forms the V-shaped isolation region.

Turning to the manufacturing method shown in FIGS. 5A through 5G, since an ordinary LOCOS method is employed to locally form the thin-film insulator layer 2a, it is easy to manufacture the IC having DI structure.

Figure 6A:
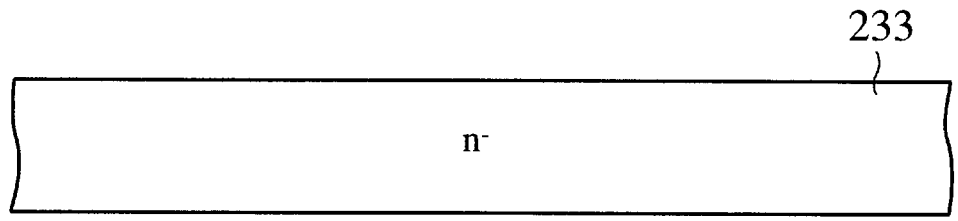
FIGS. 6A through 6G are step diagrams showing another method of manufacturing semiconductor ICs related to the first embodiment of the present invention.
Figure 6B:
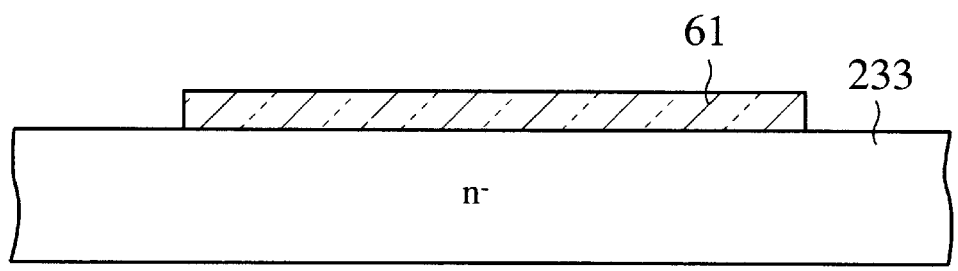
Figure 6C:
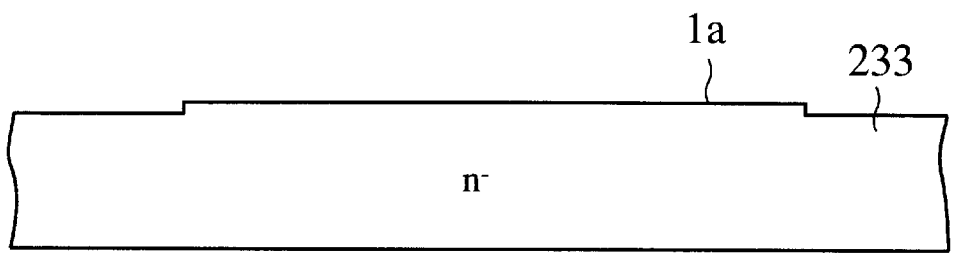

A semiconductor IC related to the first embodiment of the present invention can be manufactured also by the following steps:

Step (a): First, as shown in FIG. 6A, an n⁻ semiconductor substrate 233 is given which acts as active layers. Then, a mask material 61 such as a photo-resist or $SiO_2$ film is used to locally cover the surface of the n⁻ semiconductor substrate 233. Next, the Cl-based RIE method etc. is used to form a convex-shaped step portion 1a using the mask material 61 as a mask, as shown in FIG. 6C.

Figure 6D:
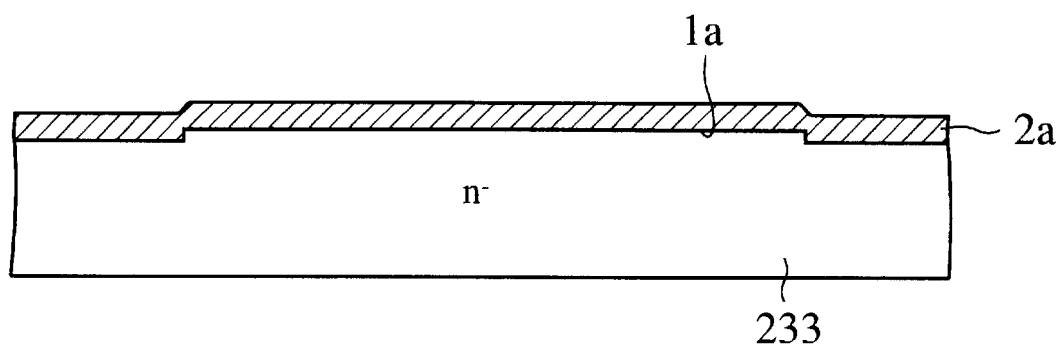
Figure 6E:
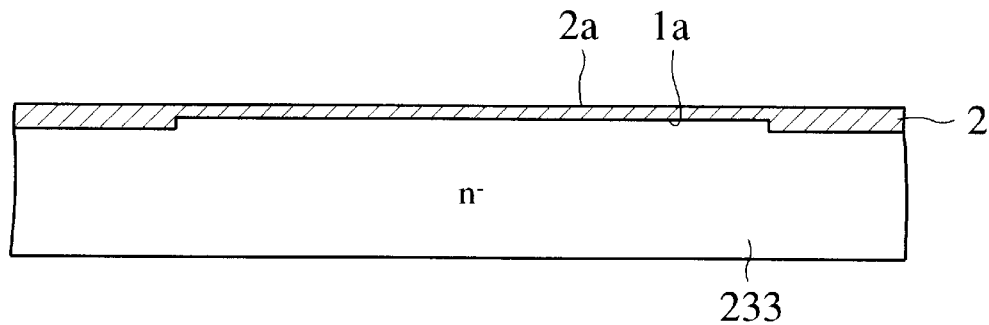

Step (b): As shown in FIG. 6D, an insulator film 2a thicker than a level difference of the convex-shaped step portion 1a is formed on the semiconductor substrate 233, then the CMP method etc. is used to flatten and polish the entire surface of the insulator film 2a so that an insulator film 2a (thin-film insulator layer) over which a surge protection circuit elements are disposed has a desired thickness, thus forming different thicknesses of an SOI insulator film 2 and the thin-film insulator layer 2a as shown in FIG. 6E. The thin-film insulator layer 2a may have a thickness of 50 to 200 nanometers.

Figure 6F:
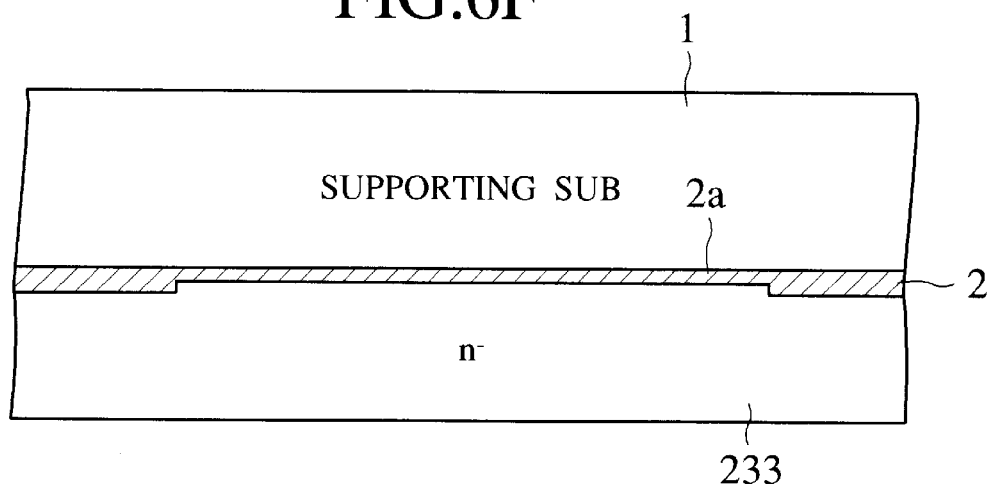
Figure 6G:
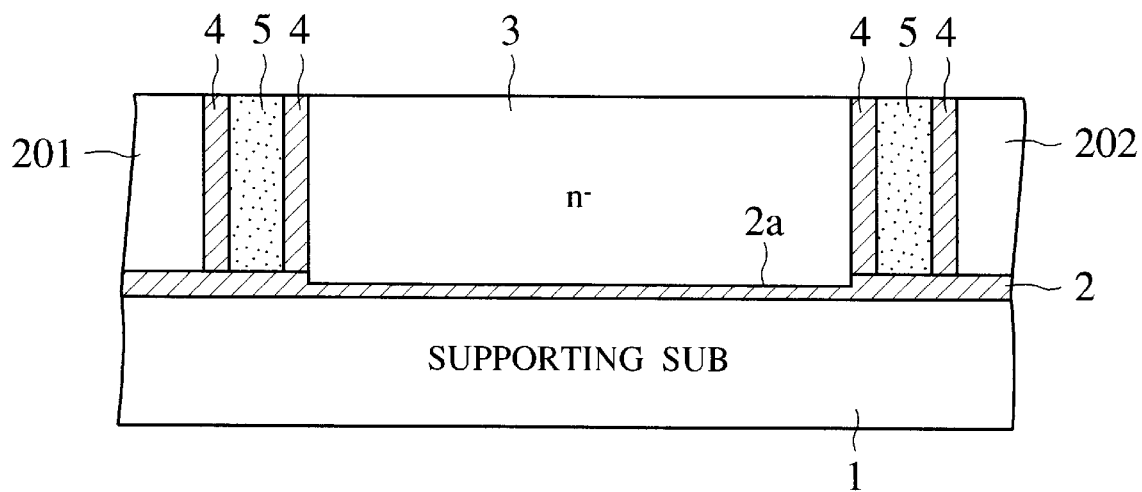

Step (c): As shown in FIG. 6F, the SDB method is used to bond a supporting substrate 1 onto the n⁻ semiconductor substrate 233 via the SOI insulator layer 2 and the thin-film insulator layer 2a, thus making an SOI substrate according to the first embodiment of the present invention which has buried insulator films provided with concave-shaped step portions at the side of the n⁻ semiconductor substrate 233.

Step (d): The n⁻ layer 233 is polished down to a desired thickness. And then the dielectric isolation regions are formed to provide first and second semiconductor active layers 3, 201, 202, etc. Then, the ion-implantation method is used to locally form an $n^+$ cathode region 11 and a p-type anode region 12 in the second semiconductor active layer as well as prescribed semiconductor regions for the internal circuit in the first semiconductor active layers 201 and 202. Then, prescribed metal wiring etc. are disposed to obtain a semiconductor IC according to the first embodiment of the present invention shown in FIG. 3B.

(Second Embodiment)

Figure 7:
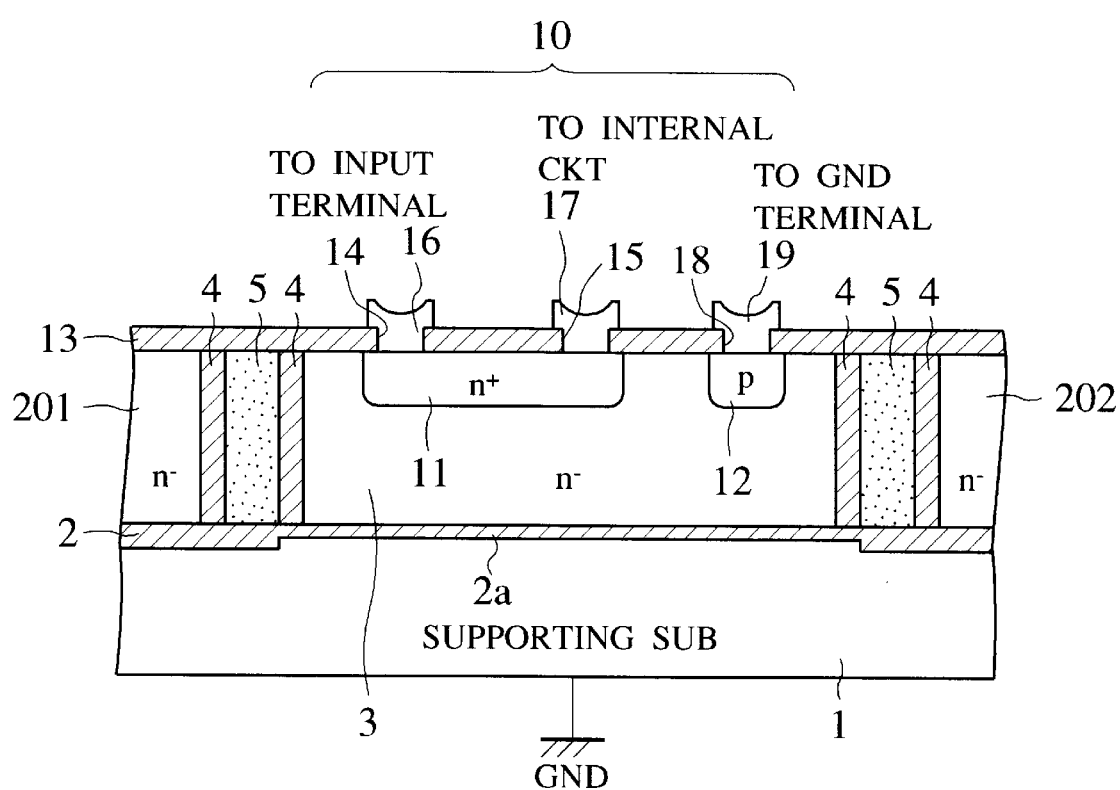
FIG. 7 is a cross-sectional view of a surge protection circuit formed in a semiconductor IC related to the second embodiment of the present invention.

FIG. 7 is a cross-sectional view of a surge protection circuit monolithically merged with internal circuitry to form a semiconductor IC related to the second embodiment of the present invention, with the same or similar reference numerals applied to the same or similar parts and elements as those in FIG. 3B. The top view of a surge protection circuit according to the second embodiment is omitted here because it is almost the same as that in FIG. 3A.

In a semiconductor IC according to the second embodiment of the present invention, a downward concave-shaped step portion is provided of an SOI structure-constituent buried insulator film at the side of a supporting substrate 1, to form partially a thick SOI insulator layer 2 and a thin thin-film insulator layer 2a. That is, the first and the second embodiments are different from each other in whether a concave-shaped step portion exists at the upper side or the lower side of the buried insulator film. The second embodiment thus enables shifting horizontally the inter-element isolation regions (the dielectric isolation regions) toward the center of the concave-shaped step portion. Hence, the area of the n⁻ layer 3 as measured in the plan view is smaller than that explained in the first embodiment.

The following describes a manufacturing method according to the second embodiment with reference to FIGS. 8A through 8G.

Figure 8A:
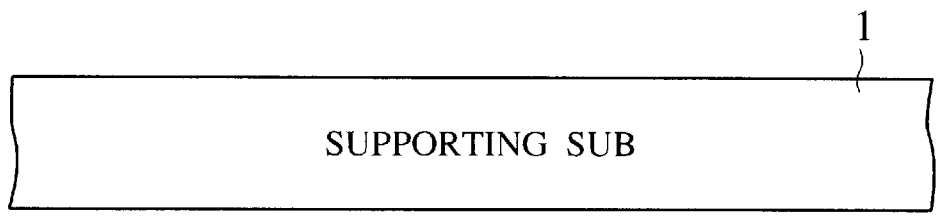
FIGS. 8A through 8G are step diagrams showing a method of manufacturing semiconductor ICs related to the second embodiment of the present invention.
Figure 8B:
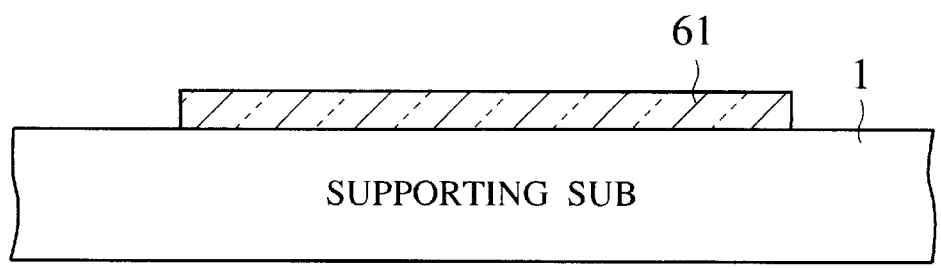
Figure 8C:
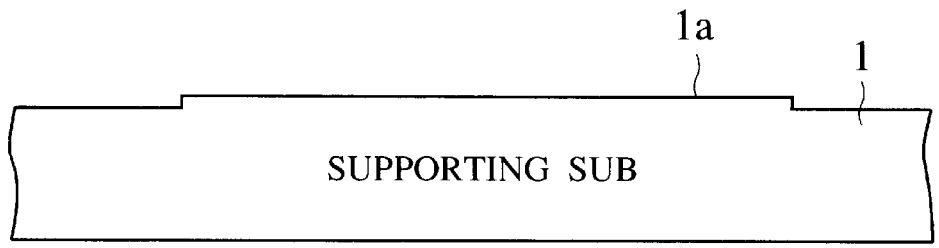

Step (a): First, as shown in FIG. 8A, a semiconductor substrate 1 which acts as a supporting substrate is given. Then, as shown in FIG. 8B, its surface is locally masked with a mask material 61 such as a photo-resist or $SiO_2$ film. Next, as shown in FIG. 8C, the Cl-based RIE method etc. is used to form an upward convex-shaped step portion 1a using the mask material 61 as a mask.

Figure 8D:
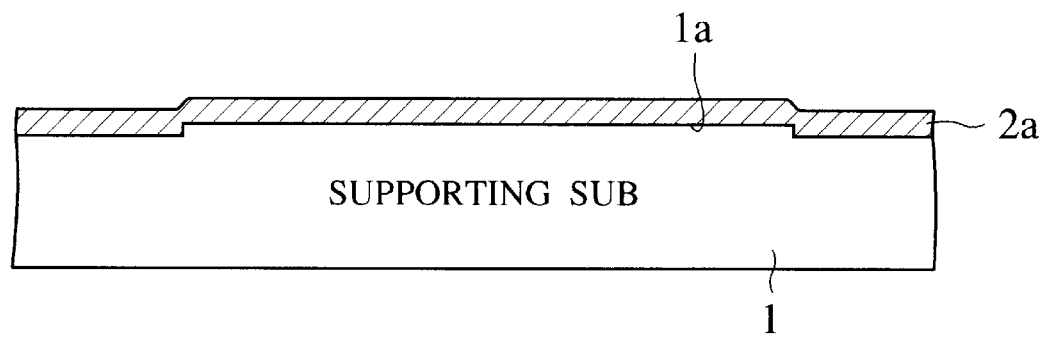
Figure 8E:
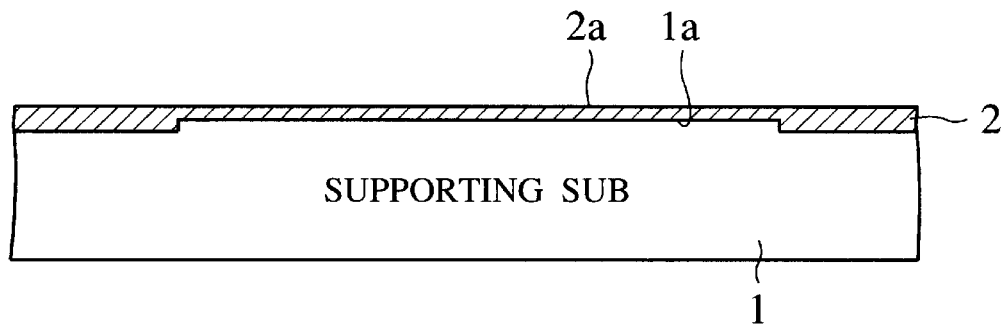

Step (b): As shown in FIG. 8D, an insulator film 2a thicker than a level difference of the convex-shaped step portion 1a is formed on the surface of the semiconductor substrate 1. Then, the CMP method etc. is used to flatten and polish the entire surface of the insulator film 2a (thin-film insulator layer) until the film 2a at a part corresponding to the area for the surge protection circuit elements, has a desired thickness. Then the structure having different thicknesses of an SOI insulator layer 2 and the thin-film insulator layer 2a is obtained as shown in FIG. 8E. The thin-film insulator layer 2a should preferably have a thickness of, for example, 50 to 200 nanometers.

Figure 8F:
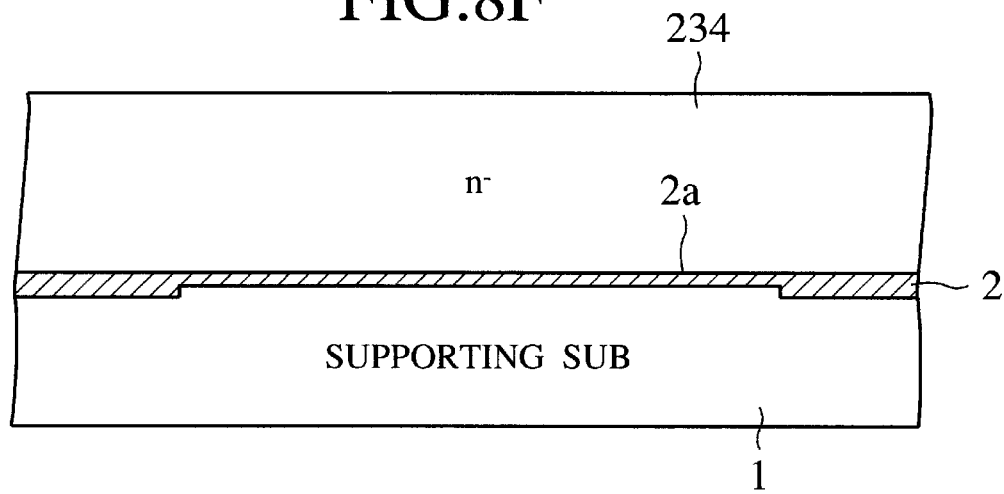

Step (c): As shown in FIG. 8F, the SDB method etc. is used to bond an n⁻ layer 234 onto the supporting substrate 1 via the SOI insulator layer 2 and the thin-film insulator layer 2a. Thus an SOI substrate, according to the second embodiment of the present invention, having a downward concave-shaped step portion at the side of the supporting substrate 1 is obtained.

Figure 8G:
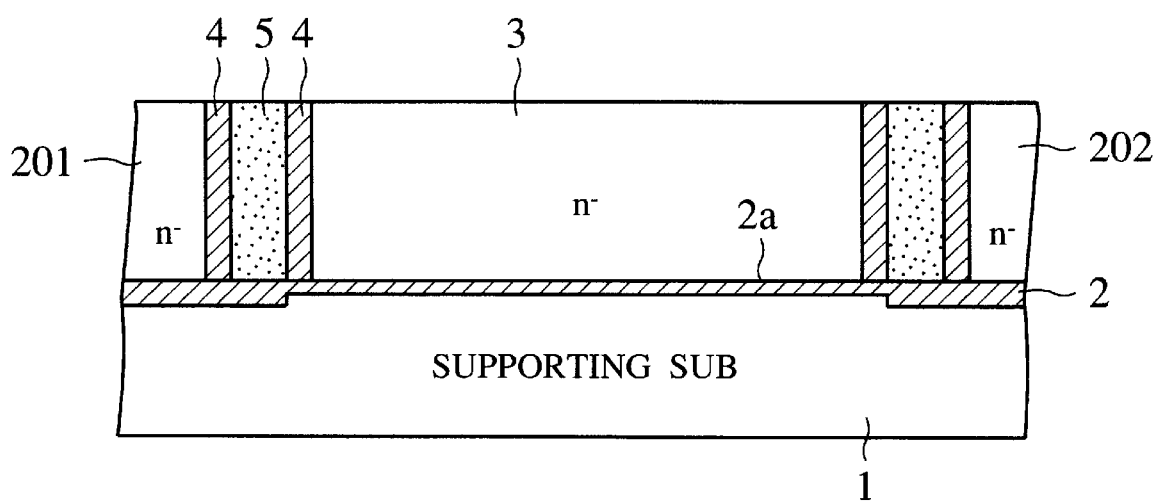

Step (d): In the same way as with the first embodiment of the present invention, the n⁻ layer 234 is polished down to a desired thickness. And, to isolate elements from each other as shown in FIG. 8G, a plurality of element-formation regions (semiconductor active layers) 3, 201, and 202 are formed. Then, the ion-implantation method etc. is used to selectively form an n⁺ cathode region 11 and a p-type anode region 12 in the second semiconductor active layer 3. Also, in the first semiconductor active layers 201 and 202, p-type and n-type regions and other prescribed semiconductor regions are formed for the internal circuit. Finally, prescribed metal wiring and other processes are performed to obtain such a semiconductor IC as shown in FIG. 7 according to the second embodiment of the present invention.

Also in the second embodiment of the present invention, a part of the buried insulator film directly under the island region 3 for surge protection circuit elements is thinned into a thin-film insulator layer 2a, so that the surge protection circuit formed in this island region 3 will have a large CR time constant value, thus improving the surge immunity. Moreover, a prescribed value of thickness can be secured of the SOI insulator layer 2 directly under the first semiconductor active layers 201 and 202 other than the second semiconductor active layer for the surge protection circuit elements, thus keeping the DC breakdown voltage from lowering without increasing the chip size as a whole.

Various modifications will become possible for those skilled in the art after receiving the teachings of the present disclosure without departing from the scope thereof. In contrast to, for example, the above-mentioned first and second embodiments where an SOI wafer is manufactured by the SDB method whereby the buried insulator film (SOI insulator layer) made of an SiO₂ film etc. is sandwiched between a supporting substrate and an n⁻ layer, the Separation by IMplanted OXygen (SIMOX) method etc. may be employed in manufacturing. The SIMOX method, as well known, implants oxygen into a silicon substrate up to a portion between the supporting substrate and the n⁻ layer and then performs desired thermal processing, to form the buried oxide film layer at the portion. In this case, by implanting oxygen to the supporting substrate or the n⁻ layer after a concave-shaped step portion of them are prepared, the projection depth of ion implantation can be effectively changed to form thin-film insulator layers whose thickness is partially decreased. Also, the acceleration voltage may be changed in selective ion implantation method. In contrast to the first and second embodiments, the SIMOX method need not perform flattening of the SOI insulator immediately before bonding.

The present invention is not limited to the protection circuit on the input side of the internal circuitry. Therefore, a surge protection circuit may of course be directly connected to the output terminal of the internal circuitry so as to work for the output side of LSI.

What is claimed is:

1. A dielectrically isolated IC merged with a surge protection circuit comprising:
   a) a supporting substrate;
   b) a first buried insulator film formed partially on the supporting substrate;
   c) a second buried insulator film thinner than the first buried insulator film formed partially on the supporting substrate;
   d) a plurality of first semiconductor active layers formed on the first buried insulator film;
   e) a second semiconductor active layer formed on the second buried insulator film; and
   f) a dielectric isolation region formed between the plurality of first semiconductor active layers themselves and also between the first and second semiconductor active layers,
   wherein the surge protection circuit is formed in the second semiconductor active layer.

2. The IC of claim 1, wherein said first and second buried insulator films shares a same top plane.

3. The IC of claim 1, wherein said first and second buried insulator films shares a same bottom plane.

4. The IC of claim 1, wherein said second semiconductor active layer is thicker than said first semiconductor active layers.

5. The IC of claim 1, wherein said first and second semiconductor active layers have essentially a same thickness.

6. The IC of claim 1, wherein said dielectric isolation region comprises a side-wall oxide film and a polysilicon film.

7. The IC of claim 6, wherein said side-wall oxide film is formed in contact with at least either said first or second semiconductor active layers.

8. The IC of claim 7, wherein the side-wall oxide film in contact with said second semiconductor active layer is formed on a top surface of said first buried insulator film.

9. The IC of claim 7, wherein the side-wall oxide film in contact with said second semiconductor active layer is formed on a top surface of said second buried insulator film.

10. The IC of claim 1,
    wherein said second semiconductor active layer is a semiconductor region having a first conductivity-type low impurity-concentration; and
    said surge protection circuit comprises a protection diode having a first conductivity-type high impurity-concentration region and a second conductivity-type high impurity-concentration region which are formed in the second semiconductor active layer.

11. The IC of claim 10,
    wherein on a top surface of said second semiconductor active layer, a surface isolation film is formed; and
    in the surface isolation film, a first contact hole and a second contact hole disposed on said first conductivity-type high impurity-concentration region as well as a third contact hole disposed on said second conductivity-type high impurity-concentration are formed mutually distantly.

12. The IC of claim 11, further comprising:
    a first surface wiring which interconnects via said first contact hole said first conductivity-type high impurity-concentration region and an input terminal;
    a second surface wiring which interconnects via said second contact hole, said first conductivity-type high impurity-concentration region and an internal circuit contained in said first semiconductor active layer, the internal circuit is protected by the surge protection circuit against a surge; and a third surface wiring which interconnects via said third contact hole said second conductivity-type high impurity-concentration region and a reference potential.

13. The IC of claim 12, wherein said supporting substrate is biased to said reference potential.

14. The IC of claim 7, wherein at least either a boundary between said side-wall oxide film and said first semiconductor active layer or a boundary between said said-wall oxide film and said second semiconductor layer is essentially perpendicular to main surfaces of said first and second semiconductor active layers.

15. The IC of claim 7, wherein at least either a boundary between said side-wall oxide film and said first semiconductor active layer or a boundary between said side-wall oxide film and said second semiconductor active layer constitutes an obliqued side-wall surface at a prescribed angle other than 90 degrees relative to main surfaces of said first and second semiconductor active layers to form a V-shaped isolation region.

16. The IC of claim 13, wherein a surge voltage is prevented from being raised by increasing a value of CR time constant ascribed to a parallel-plate capacitor C and a parasitic resistor R, the parallel-plate capacitor C is made up of said supporting substrate, said second buried insulator film, and said second semiconductor active layer.

17. The IC of claim 16, wherein said parasitic resistor R has a resistance value ascribed to a resistor component in said second semiconductor active layer and a resistor component of said first conductivity-type high impurity-concentration region.

* * * * *